United States Patent
Lin et al.

(10) Patent No.: US 7,507,653 B2
(45) Date of Patent: Mar. 24, 2009

(54) METHOD OF FABRICATING METAL COMPOUND DOTS DIELECTRIC PIECE

(75) Inventors: Cha-Hsin Lin, Tainan (TW); Pei-Jer Tzeng, Taipei County (TW); Maikap Siddheswar, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 96 days.

(21) Appl. No.: 11/466,773

(22) Filed: Aug. 24, 2006

(65) Prior Publication Data

US 2008/0095931 A1   Apr. 24, 2008

(30) Foreign Application Priority Data

Jul. 12, 2006   (TW) ............... 95125405 A

(51) Int. Cl.
H01L 21/20   (2006.01)
(52) U.S. Cl. ............. 438/591; 438/783; 438/396
(58) Field of Classification Search .......... 438/9, 438/962, 665, 263, 264, 197, 478, 591, 783, 438/396
See application file for complete search history.

(56) References Cited

U.S. PATENT DOCUMENTS

| | | | |
|---|---|---|---|
| 6,194,237 B1 * | 2/2001 | Kim et al. | 438/22 |
| 6,756,292 B2 * | 6/2004 | Lee et al. | 438/591 |
| 6,981,666 B2 | 1/2006 | Brownbridge et al. | |
| 7,022,628 B2 * | 4/2006 | Kim et al. | 438/478 |
| 7,309,650 B1 * | 12/2007 | Wang et al. | 438/665 |
| 2003/0092227 A1 | 5/2003 | Lee et al. | |
| 2003/0183870 A1 | 10/2003 | Sugiyama | |
| 2004/0175926 A1 * | 9/2004 | Wang et al. | 438/627 |
| 2004/0219750 A1 | 11/2004 | Chang et al. | |
| 2005/0162958 A1 | 7/2005 | Chae et al. | |
| 2006/0205132 A1 * | 9/2006 | Bhattacharyya | 438/197 |

* cited by examiner

*Primary Examiner*—Evan Pert
*Assistant Examiner*—Selim Ahmed
(74) *Attorney, Agent, or Firm*—Jianq Chyun IP Office

(57) ABSTRACT

A method of fabricating a dielectric piece which includes metal compound dots is provided. A stacked layer formed over the substrate includes a metal compound layer and an energy barrier layer. A process such as an oxidization annealing process is then performed so that the metal compound layer is transformed into a great number of crystalline metal compound dots distributed in the energy barrier layer.

17 Claims, 4 Drawing Sheets

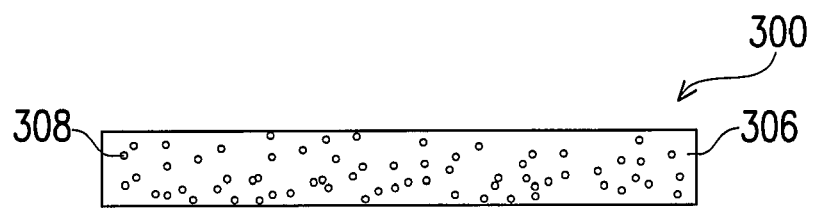
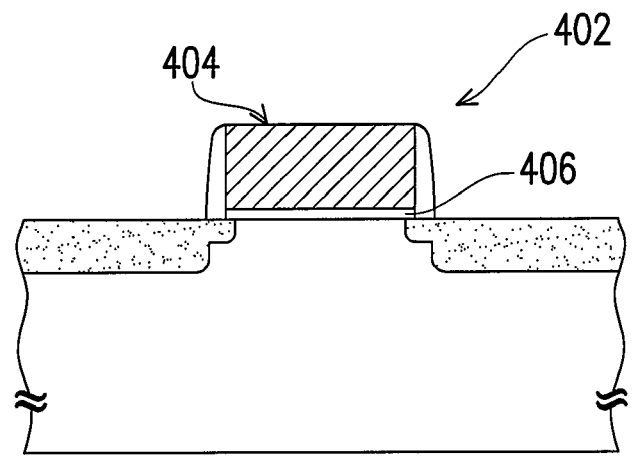
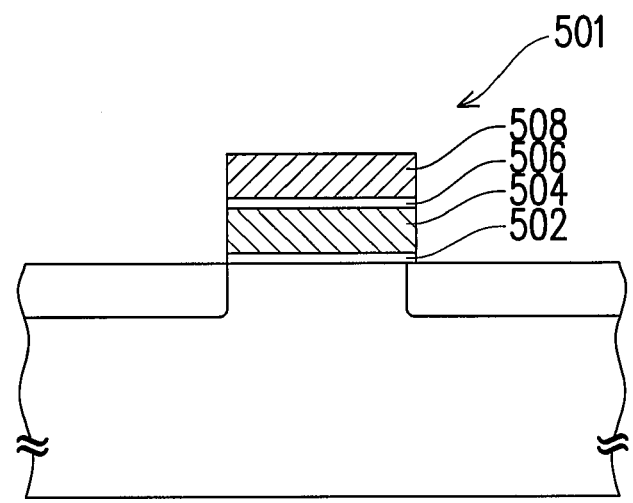

METHOD OF FABRICATING METAL COMPOUND DOTS DIELECTRIC PIECE

CROSS-REFERENCE TO RELATED APPLICATION

This application claims the priority benefit of Taiwan application serial no. 95125405, filed Jul. 12, 2006. All disclosure of the Taiwan application is incorporated herein by reference.

BACKGROUND OF THE INVENTION

1. Field of the Invention

This invention relates to a dielectric material layer and a method of fabricating the same, and more particularly to a dielectric piece comprising metal compound dots and a method of fabricating the same.

2. Description of Related Art

Derived from semiconductor technologies, a variety of memory devices such as dynamic random access memory (DRAM), static random access memory (SRAM), and non-volatile memory (NVRAM) nowadays play a significant role in the semiconductor industry. With the development and advancement of the semiconductor technology, these memory devices have been extensively applied to personal computers, mobile phones, internet, and so forth. These electronic products have become, little by little, indispensable to human life.

Owing to size reduction of semiconductor devices, the industry is facing a number of challenges, such as power consumption arisen from current leakage through DRAM, excessive area accounted by SRAM, high voltage requirement for performing reading/writing function in flash memory, and so on. Accordingly, it is urgent to develop new memory devices possessing advantages such as high density, non-volatilization, high-speed reading/writing capacity, unlimited numbers of reading/writing, low operational voltage, low power consumption, compatibility with current CMOS processes, and so forth.

Among the newly developed memory devices, nano-dots non-volatile memory devices at present draw a great attention. Nano-dots non-volatile memory device includes a charge storage layers having a great number of nano-dots formtherein, each of which serves as an independent charge storage center. Hence, even if a tunneling oxide layer includes pathways for leakage currents, nano-dots non-volatile memory still has superior charge retention capability. Despite the shrink in size, the nano-dots non-volatile memory is well characterized in storing charges into nano-dots layers so as to perform a charge storage function of the memory. Nowadays, silicon nanocrystal dots, germanium nanocrystal dots, or metal nano-dots dielectric layer serving as a charge storage layer to instead of the traditional silicon nitride charge storage layer are studied.

SUMMARY OF THE INVENTION

The present invention is to provide a dielectric piece including metal compound dots to store charges.

The present invention is to further provide a simple method of fabricating a dots dielectric piece.

The present invention is to further provide a simple method of fabricating a nano-dots dielectric piece.

One embodiment of the present invention is to provide a method of fabricating a dielectric piece including metal compound dots. A stack layer including a metal nitride layer and an energy barrier layer is formed over a substrate. Afterward, a treatment process is performed to transform the metal nitride layer into a plurality of crystalline metal compound dots distributed in the energy barrier layer.

One embodiment of the present invention is to provide a method of fabricating a dielectric piece including metal compound dots. A stack layer including a metal nitride layer and an energy barrier layer is formed over a substrate. Afterward, an annealing process is performed to transform the metal compound layer in the stack layer into a plurality of crystalline metal compound dots distributed in the energy barrier layer.

One embodiment of the invention is to provide a dielectric piece. The dielectric piece includes an energy barrier layer and a plurality of crystalline metal compound dots distributed in the energy barrier layer. The material of the energy barrier layer is different from that of the crystalline metal compound dots.

The method of fabricating the dielectric piece including metal compound dots in accordance with the present invention is simple, and can be used for mass production of semiconductors devices.

Due to its capability of retaining charges, the dielectric piece of the present invention meets the requirements of semiconductor devices in this and the next generation so as to be applied to complementary metal oxide semiconductors (CMOS), non-volatile memory devices, or capacitors as inter-gate dielectric layers, charge storage layers, or dielectric layers of capacitors. Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

BRIEF DESCRIPTION OF THE DRAWINGS

FIG. 3 is a schematic cross-sectional diagram showing the dielectric piece according to an embodiment of the present invention.

FIG. 4 schematically illustrates an application of the dielectric piece of the present invention to a CMOS.

FIG. 5 schematically illustrates an application of the dielectric piece of the present invention to a flash memory device.

DESCRIPTION OF THE PREFERRED EMBODIMENTS

A method of fabricating a dielectric piece includes metal compound dots is illustrated in the following embodiments. A stack layer including an energy barrier layer and a metal nitride layer or a metal oxide layer is formed over a substrate.

Afterward, a process is performed to transform the metal nitride layer or the metal oxide layer in the stack layer into a plurality of crystalline metal compound dots distributed in the energy barrier layer.

The following takes several embodiments to describe the present invention, but not limited to.

First Embodiment

Figure 1A:
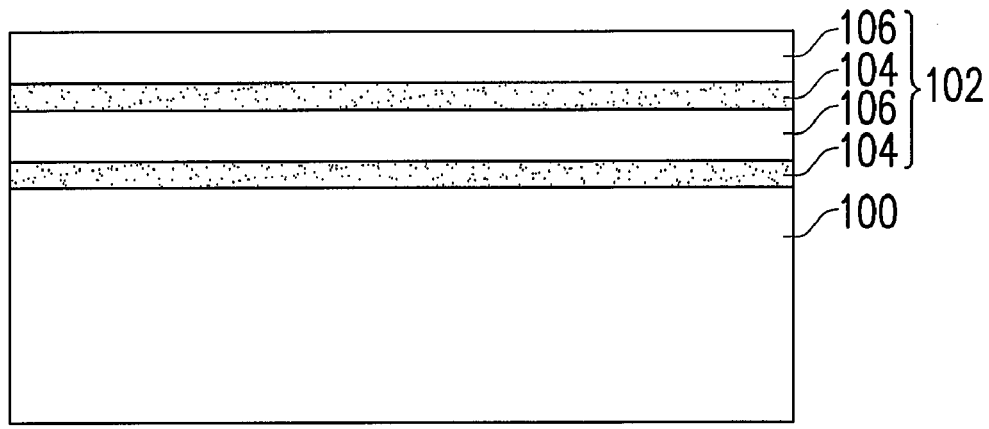
FIGS. 1A through 1B are schematic cross-sectional views showing a method of fabricating a dielectric piece comprising metal compound dots according to one embodiment of the present invention.
Figure 1B:
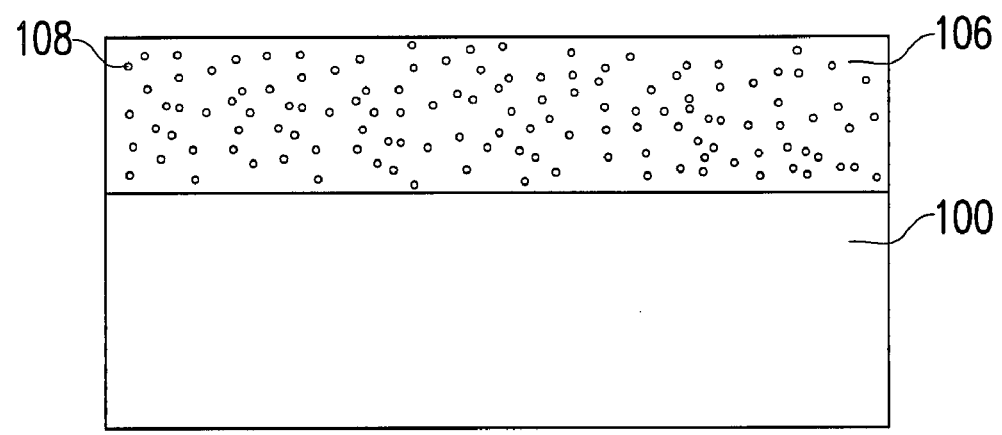

FIGS. 1A through 1B are schematic cross-sectional views showing a method of fabricating a dielectric piece comprising metal compound dots according to one embodiment of the present invention.

Referring to FIG. 1A, a stack layer 102 is formed over a substrate 100. The stack layer 102 includes a metal nitride layer 104 and an energy barrier layer 106. The stack layer 102 shown in the FIG. 1A includes two metal nitride layers 104 and two energy barrier layers 106 alternately. The metal nitride layers 104 and the energy barrier layers 106 are alternately stacked. In one embodiment of the present invention, the stack layer 102 includes one metal nitride layer 104 sandwiched in between two energy barrier layers 106, for example. Moreover, the stack layer 102 in another embodiment of the present invention includes one energy barrier layer 106 sandwiched in between two metal nitride layers 104. The material of the metal nitride layer 104 includes refractory metal nitride, such as titanium nitride, zirconium nitride, or hafnium nitride, which can be formed through an atomic layer chemical vapor deposition (ALD) process. The thickness of the metal nitride layer 104 is determined in accordance with the requirements of design. For example, in order to form the metal compound nanocrystal dots, the thickness of the metal nitride layer 104 is less than or equal to 10 angstroms. In one embodiment of the present invention, the thickness of the metal nitride layer 104 is approximately 3-6 angstroms. The material of the energy barrier 106 is different from that of the crystalline metal compound dots transformed from the metal nitride layer 104. While applied to semiconductor devices, the selection of the material of the energy barrier 106 can consider a material whose conductive band and valence band are relative to those of semiconductor, such as silicon. Mostly, the conductive band the energy barrier 106 is 1 eV higher than that of semiconductors, while the valence band the energy barrier 106 is 1 eV lower than that of semiconductors. Thus, the potential energy barrier can be higher enough to prevent electrons or holes passing through the energy barrier 106, which can achieve insulation properties. The material of the energy barrier layer 106 can be selected from a group consisting of $Al_2O_3$, $Ta_2O_5$, BaO, $ZrO_2$, $LaAlO_3$, $La_2O_3$, SrO, $Y_2O_3$, $Si_3N_4$, $Si_xN_y$, $HfSiO_x$, $ZrSiO_x$, MgO, $SiO_x$, and $SiO_2$, and combinations thereof. The thickness of the energy barrier layer 106 is determined in accordance with the requirements of design. In one embodiment of the present invention, the thickness of the energy barrier 106 is about 5-20 angstroms, for example.

Afterward, referring to FIG. 1B, a process is performed to transform the metal nitride layer 104 in the stack layer 102 into a plurality of crystalline metal compound dots 108 distributed in the energy barrier layer 106. The crystalline metal compound dots 108 are, for example, crystalline metal oxide dots, such as crystalline titanium oxide dots, crystalline zirconium oxide dots, or crystalline hafnium oxide dots. In one embodiment of the present invention, the process is to perform an annealing operation in oxygen-free ambiance, such as nitrogen, argon, hydrogen, or ammonia ambiance, to transform the metal nitride layer 104 in the stack layer 102 into a plurality of metal nitride dots distributed in the energy barrier layer 106. Afterward, in oxygen ambiance, the metal nitride dots are transformed into a plurality of crystalline metal oxide dots 108. In another embodiment of the present invention, the treatment process includes an oxidation annealing operation in air, oxygen, nitric oxide, or nitrogen dioxide ambiance, for example, to directly transform the metal nitride layer 104 into crystalline metal oxide dots 108. In another embodiment of the present invention, the crystalline metal compound dots 108 are crystalline metal oxide dots which are made during the conveying process after the stack layer 102 is formed. The stack layer 102 may be exposed to the oxygen in the air during the conveying process. The oxygen carried by the stack layer 102 can directly transforms the metal nitride layer 104 into the crystalline metal oxide dots 108, though the annealing operation is in an oxygen-free or a micro-oxygen ambiance.

Second Embodiment

Figure 2A:
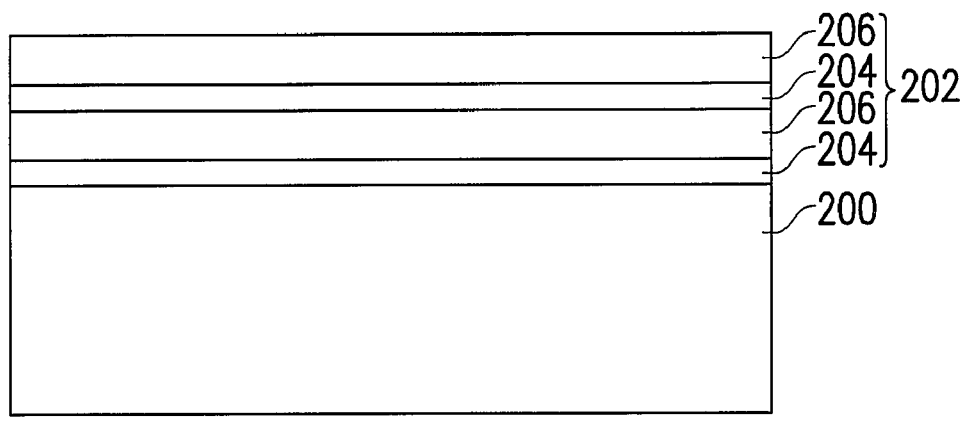
FIGS. 2A through 2B are schematic cross-sectional views showing a method for fabricating the dielectric piece comprising metal compound dots according to another embodiment of the present invention.
Figure 2B:
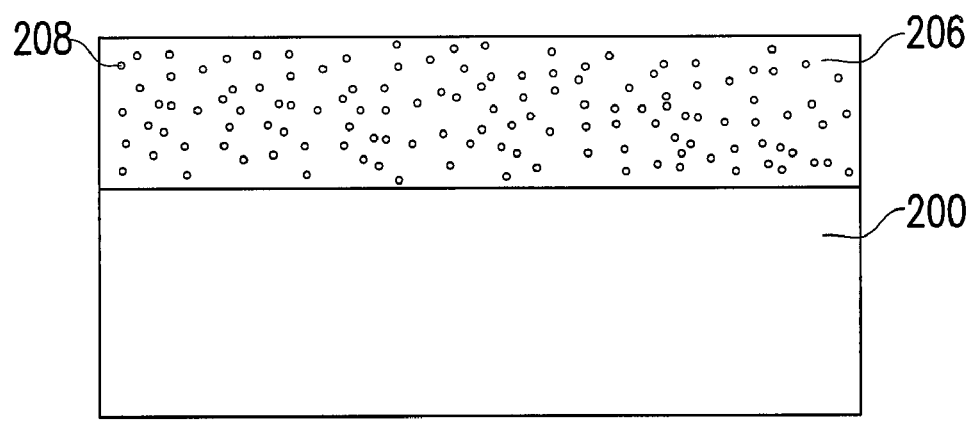

FIGS. 2A through 2C are schematic cross-sectional views showing a method of fabricating the dielectric piece comprising metal compound dots according to another embodiment of the present invention.

Referring to FIG. 2A, a stack layer 202 is formed over a substrate 200. The stack layer 202 includes a metal compound layer 204 and an energy barrier layer 206. The stack layer 202 shown in the FIG. 2A includes two metal compound layers 204 and two energy barrier layers 206. The metal compound layers 204 and the energy barrier layers 206 are alternately stacked. In one embodiment of the present invention, the stack layer 202 includes one metal compound layer 204 sandwiched in between two energy barrier layers 206. Moreover, the stack layer 202 in another embodiment of the present invention includes one energy barrier layer 206 sandwiched in between two metal compound layers 204. The material of the metal compound layer 204 includes a refractory metal oxide, such as titanium oxide, zirconium oxide, or hafnium oxide. The material is formed through an atomic layer chemical vapor deposition (ALD) process. The thickness of the metal compound layer 204 is determined in accordance with the requirements of design. For example, in order to form metal compound nano-dots, the thickness of the metal compound layer 204 is less than or equal to 10 angstroms. In one embodiment of the present invention, the thickness of the metal compound layer 204 is about 3 angstroms. The material of the energy barrier 206, different from that of the metal compound layer 204, is selected from a group consisting of $Al_2O_3$, $Ta_2O_5$, BaO, $ZrO_2$, $LaAlO_3$, $La_2O_3$, SrO, $Y_2O_3$, $Si_3N_4$, $Si_xN_y$, $HfSiO_x$, $ZrSiO_x$, MgO, $SiO_x$, and $SiO_2$, and combinations thereof. The thickness of the energy barrier layer 206 is determined in accordance with the requirements of design. In one embodiment of the present invention, the thickness of each energy barrier layer 206 is about 5-20 angstroms, for example.

Afterward, referring to FIG. 2B, a process is performed to transform the metal compound layer 204 in the stack layer 202 into a plurality of crystalline metal compound dots 208 distributed in the energy barrier layer 206. The crystalline metal compound dots 208 are, for example, refractory metal compound dots, such as crystalline titanium oxide dots, crystalline zirconium oxide dots, or crystalline hafnium oxide dots. In one embodiment of the present invention, the process is to perform an annealing operation in oxygen-free ambiance such as a nitrogen, argon, hydrogen, or ammonia ambiance to transform the metal compound layer in the stack layer 202 into a plurality of crystalline metal compound dots 208 distributed in the energy barrier layer 206. In another embodiment of the present invention, the process includes an oxidation annealing operation in an oxygen, nitric oxide, or nitrogen dioxide ambiance, for example, to transform the metal nitride layer 204 into the crystalline metal oxide dots 208.

Referring to FIG. 3, a dielectric piece 300 can be formed through the aforesaid methods. The dielectric piece 300 includes an energy barrier 306 and a plurality of crystalline metal compound dots 308 distributed in the energy barrier 306. The crystalline metal compound dots 308 include crystalline titanium oxide dots, crystalline zirconium oxide dots, or crystalline hafnium oxide dots. The material of the energy barrier 306, different from that of the crystalline metal compound dots 308, is selected from a group consisting of $Al_2O_3$, $Ta_2O_5$, BaO, $ZrO_2$, $LaAlO_3$, $La_2O_3$, SrO, $Y_2O_3$, $Si_3N_4$, $Si_xN_y$, $HfSiO_x$, $ZrSiO_x$, MgO, $SiO_x$, and $SiO_2$, and combinations thereof. The crystalline metal compound dots 308 in the dielectric piece 300 can be as small as nano-dots and be limited within the energy barrier layer 306. Accordingly, the charges in the dielectric piece 300 are well retained. This dielectric piece can be extensively applied to fabricate integrated circuits.

Figure 6:
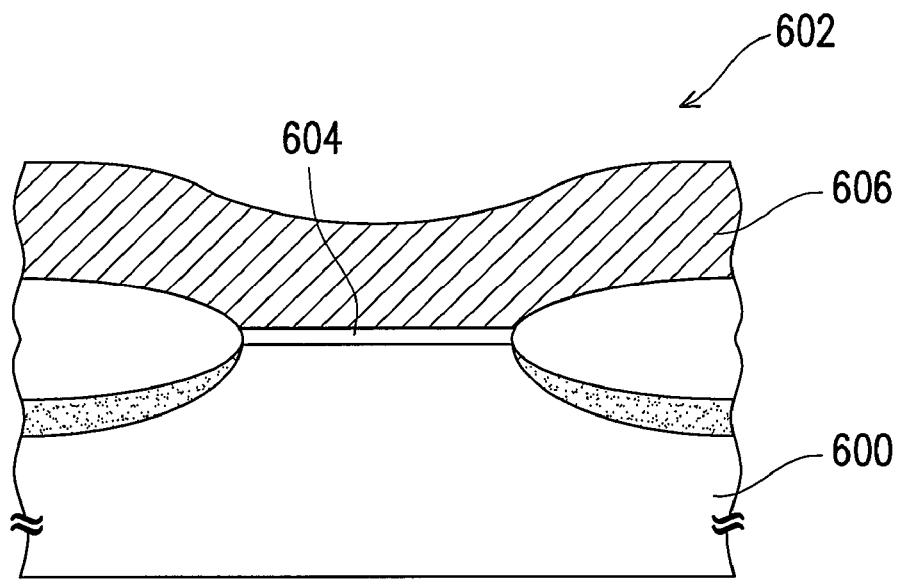
FIG. 6 schematically illustrates an application of the dielectric piece of the present invention to a flash memory device.
Figure 7:
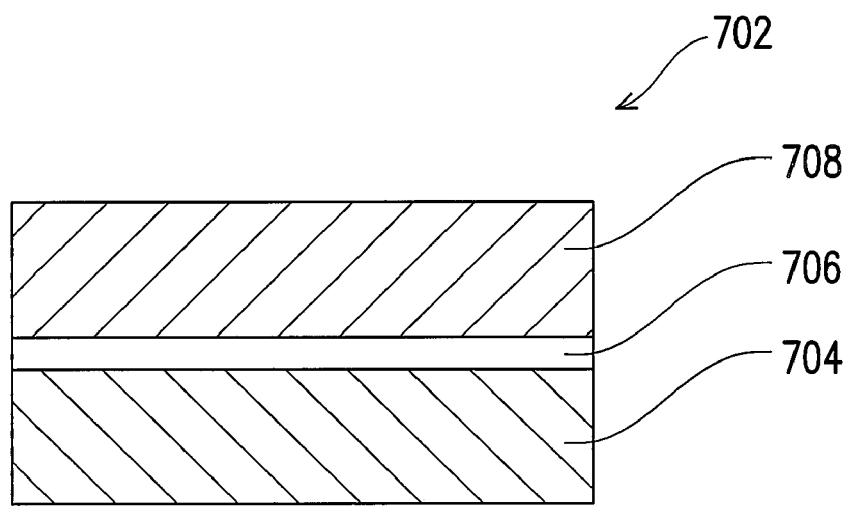
FIG. 7 schematically illustrates an application of the dielectric piece of the present invention to a capacitor.

The dielectric piece of the present invention can also be applied to fabricate semiconductor devices. For example, as shown in FIG. 4, the dielectric piece of the present invention can be applied to a CMOS 402 as a gate dielectric layer 406 of a gate structure 404. The dielectric piece of the present invention can be applied to non-volatile memory devices. Referring to FIG. 5, for example, the dielectric piece of the present invention can be applied to a flash memory device 501 as a replacement of a floating gate 504 for charge storage. Moreover, referring to FIG. 6, the dielectric piece can be applied to a silicon nitride read-only-memory device 602 as a charge storage layer 604 between a control gate 606 and a substrate 600, replacing traditional oxide/nitride/oxide (ONO) layer. Furthermore, referring to FIG. 7, the dielectric piece can as well be applied to a capacitor 702 as a dielectric material 706 between two electrodes 704 and 708. In application, the dielectric piece can certainly be utilized alone or together with other dielectric materials.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method of fabricating a dielectric piece including a plurality of crystalline metal compound dots, the method comprising:
   forming a stack layer over a substrate, wherein the stack layer comprises a first metal compound layer and an energy barrier layer, wherein the material of the first metal compound layer is a compound constituted of metal and non-metal; and,
   conducting a treatment process to transform the first metal compound layer into the crystalline metal compound dots distributed in the energy barrier layer.

2. The method of claim 1, wherein the first metal compound layer is a metal nitride layer, the material of the crystalline metal compound dots is metal oxide, and the treatment process comprises:
   performing an annealing operation to transform the metal nitride layer in the stack layer into a plurality of metal nitride dots distributed in the energy barrier layer; and
   transforming the metal nitride dots into a plurality of crystalline metal oxide dots in ambiance containing oxygen.

3. The method of claim 2, wherein the annealing operation is preformed in nitrogen, argon, hydrogen, or ammonia ambiance.

4. The method of claim 1, wherein the first metal compound layer is a metal nitride layer, the material of the crystalline metal compound is metal oxide, and the treatment process comprises an oxidation annealing operation.

5. The method of claim 4, wherein the oxidation annealing operation is performed in air, oxygen, nitric oxide, or nitrogen dioxide ambiance.

6. The method of claim 1, wherein the first metal compound layer is a metal nitride layer and the metal nitride layer comprises a titanium nitride layer, a zirconium nitride layer, or an hafnium nitride layer.

7. The method of claim 6, wherein the method of fabricating the metal nitride layer comprises an atomic layer chemical vapor deposition (ALD) process.

8. The method of claim 6, wherein a thickness of the metal nitride layer is less than and equal to 10 angstroms.

9. The method of claim 1, wherein the material of the energy barrier layer is selected from a group consisting of $Al_2O_3$, $Ta_2O_5$, BaO, $ZrO_2$, $LaAlO_3$, $La_2O_3$, SrO, $Y_2O_3$, $Si_3N_4$, $Si_xN_y$, $HfSiO_x$, $ZrSiO_x$, MgO, $SiO_x$ and $SiO_2$, and the combinations thereof.

10. The method of claim 1, wherein the first metal compound layer is a metal oxide layer and the second metal compound is the metal oxide.

11. The method of claim 10, wherein the metal oxide layer comprises a titanium oxide layer, a zirconium oxide layer, or an hafnium oxide layer.

12. The method of claim 10, wherein the method of fabricating the metal oxide layer comprises an atomic layer chemical vapor deposition process.

13. The method of claim 10, wherein a thickness of the metal oxide layer is less than or equal to 10 angstroms.

14. The method of claim 10, wherein the treatment process comprises performing an annealing operation and the annealing operation is performed in air, oxygen, nitric oxide, or nitrogen dioxide ambiance.

15. The method of claim 10, wherein the treatment process comprises performing an annealing operation and the annealing operation is preformed in nitrogen, argon, hydrogen, or ammonia ambiance.

16. The method of claim 1, wherein the method of fabricating the metal compound layer comprises an atomic layer chemical vapor deposition process.

17. The method of claim 1, wherein a thickness of the metal compound layer is less than or equal to 10 angstroms.

* * * * *